(12) United States Patent
Butash

(10) Patent No.: US 6,990,060 B2
(45) Date of Patent: Jan. 24, 2006

(54) POLYPHASE-DISCRETE FOURIER TRANSFORM (DFT) SUB-BAND DEFINITION FILTERING ARCHITECTURE

(75) Inventor: Thomas C. Butash, Centreville, VA (US)

(73) Assignee: BAE Systems, Manassas, VA (US)

( * ) Notice: Subject to any disclaimer, the term of this patent is extended or adjusted under 35 U.S.C. 154(b) by 772 days.

(21) Appl. No.: 09/780,348

(22) Filed: Feb. 12, 2001

(65) Prior Publication Data

US 2001/0036152 A1    Nov. 1, 2001

Related U.S. Application Data

(60) Provisional application No. 60/181,512, filed on Feb. 11, 2000.

(51) Int. Cl.
*H04J 11/00* (2006.01)
(52) U.S. Cl. .................................... 370/210; 370/497
(58) Field of Classification Search ................ 370/210, 370/480, 497
See application file for complete search history.

(56) References Cited

U.S. PATENT DOCUMENTS

| | | | |
|---|---|---|---|
| 4,754,449 A | 6/1988 | Crookshanks | |
| 4,785,447 A | 11/1988 | Ichiyoshi | |
| 4,792,943 A | 12/1988 | Gockler | |
| 4,839,889 A | 6/1989 | Gockler | |
| 4,896,320 A | 1/1990 | Gockler | |
| 5,268,905 A | 12/1993 | Soloff | |
| 5,293,329 A | 3/1994 | Wishart | |
| 5,293,382 A | 3/1994 | Carson | |
| 5,299,192 A | 3/1994 | Guo et al. | |
| 5,323,391 A | 6/1994 | Harrison | |
| 5,396,489 A | 3/1995 | Harrison | |
| 5,587,939 A | 12/1996 | Soleymani et al. | |
| 5,848,097 A * | 12/1998 | Carney et al. | 370/210 |
| 5,867,479 A | 2/1999 | Butash | |
| 6,091,704 A | 7/2000 | Butash | |
| 6,118,794 A * | 9/2000 | Cornfield et al. | 370/497 |
| 6,351,451 B1 * | 2/2002 | Butash | 370/210 |
| 6,493,358 B1 * | 12/2002 | Soleymani | 370/480 |
| 6,590,871 B1 * | 7/2003 | Adachi | 370/307 |

* cited by examiner

*Primary Examiner*—Ricky Ngo
*Assistant Examiner*—Nittaya Juntima
(74) *Attorney, Agent, or Firm*—Swidler Berlin LLP

(57) ABSTRACT

A system and method for demultiplexing an RF signal including nested frequency division multiplexed (FDM) channels is disclosed. The system can demultiplex an RF signal including at least two nested sets of FDM channels extending over a bandwidth B.

15 Claims, 12 Drawing Sheets

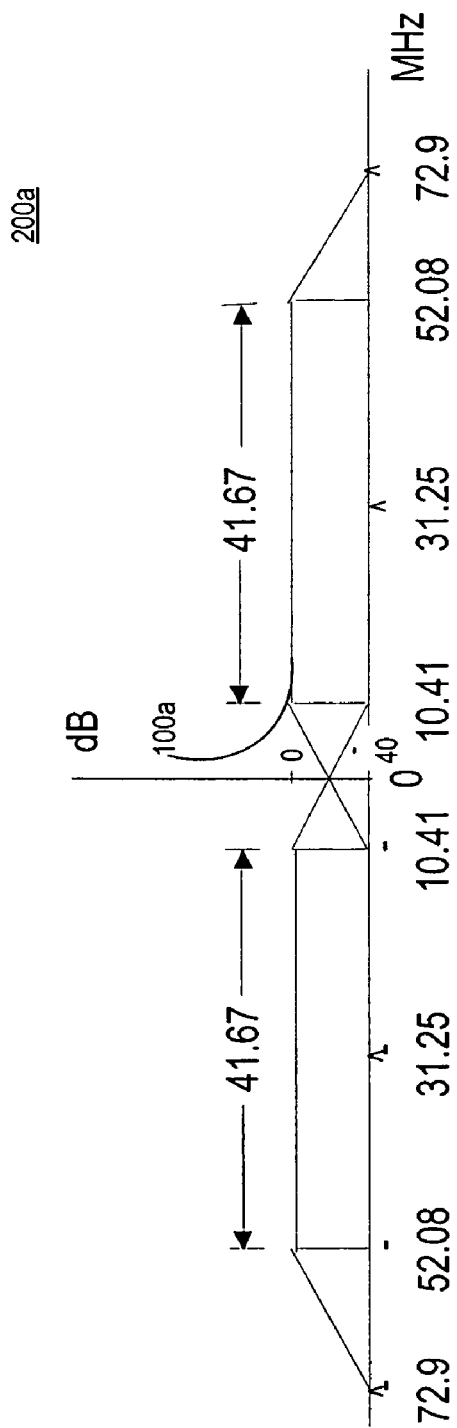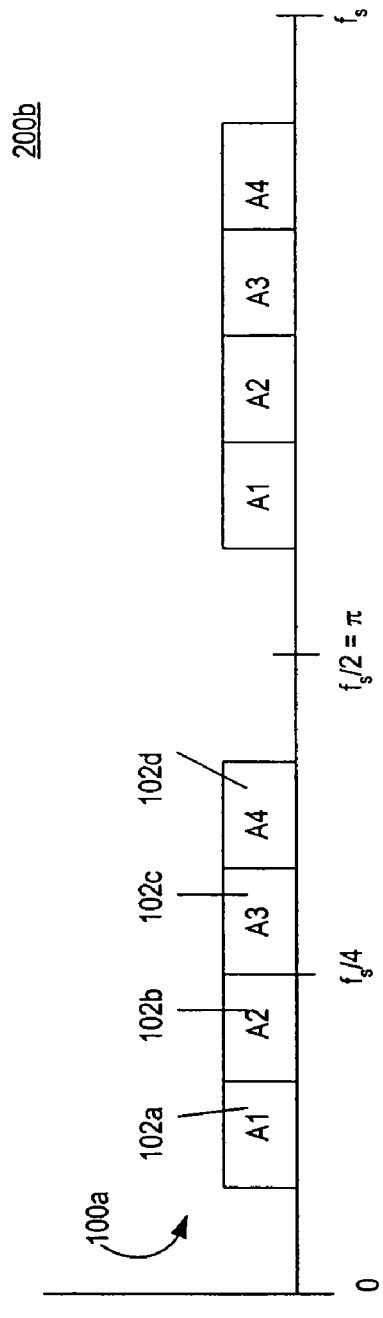

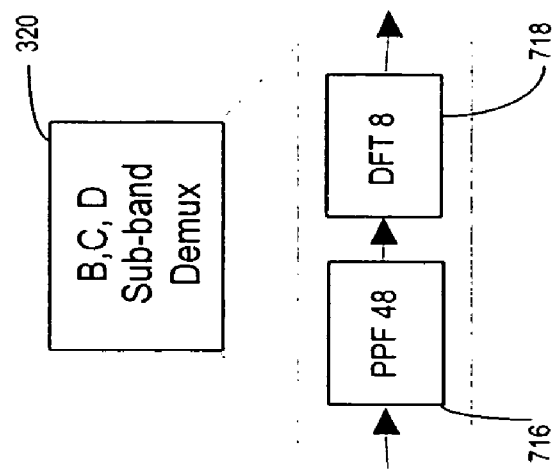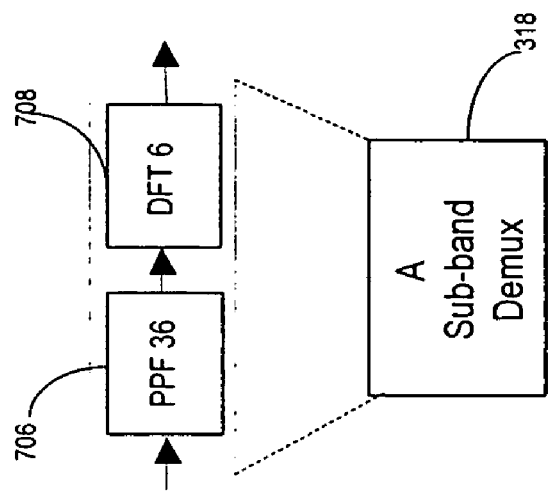
FIG. 7A

POLYPHASE-DISCRETE FOURIER TRANSFORM (DFT) SUB-BAND DEFINITION FILTERING ARCHITECTURE

CROSS-REFERENCE TO RELATED APPLICATION

The following application of common assignee may contain common disclosure with the present application:

Provisional U.S. Patent Application Ser. No. 60/181,512 entitled "Polyphase-Discrete Fourier Transform (DFT) Sub-band Definition Filtering Architecture," to Thomas C. Butash, filed Feb. 11, 2000, the contents of which are hereby incorporated by reference in their entireties.

BACKGROUND OF THE INVENTION

1. Field of the Invention

The present invention relates generally to demultiplexing large numbers of channels, and more particularly, to demultiplexing nested sets of frequency division multiplexed (FDM) channels.

2. Related Art

The polyphase-discrete fourier transform (PPF-DFT) filter bank is widely recognized as the most computationally efficient means of demultiplexing a group of uniformly spaced frequency division multiplexed (FDM) channels of equal bandwidth. However, many applications require a prohibitively large number (e.g., much greater than 32) of FDMchannels to be demultiplexed.

Unfortunately, directly demultiplexing a large number of channels requires a higher order PPF-DFT filter bank, which in turn can only be implemented with higher coefficient and arithmetic bit widths. Increasing coefficient and arithmetic bit widths increases implementation power and mass; two precious commodities in short supply on communications satellites.

It is desirable therefore that a computationally efficient method to demultiplex a plurality of nested sets of FDM channels that overcomes the shortcomings of conventional methods be provided.

SUMMARY OF THE INVENTION

An exemplary embodiment of the present invention is directed to a system, method and computer program product for demultiplexing an RF signal including nested sets of frequency division multiplexed (FDM) channels.

In an exemplary embodiment, a system demultiplexes an RF signal including at least two nested sets of frequency division multiplexed (FDM) channels extending over a bandwidth B. The system can include a baseband converter that converts the RF signal to a baseband signal where the center frequency of the baseband signal is offset from DC by an amount equal to an integer multiple of the channel spacing of a widest of the nested FDM channels; an analog to digital converter (ADC) that converts the baseband signal to a digital signal at a sampling rate equal to four times the offset; a complex baseband digital signal generator, coupled to the analog to digital converter, that performs a half-band complex bandshift of the digital signal and that filters the half-band complex bandshifted signal with a two to one decimating, symmetric, half-band finite impulse response (FIR) filter to generate a complex baseband digital signal; a k stage sub-band definition network, coupled to the complex baseband digital signal generator, that divides the complex baseband digital signal into k sets of sub-band output signals, where each stage of the k stage sub-band definition network includes a plurality of parallel polyphase-discrete Fourier transform (PPF-DFT) filter banks, where the PPF-DFT filter banks are preceded, where appropriate to align sub-band signals with filter pass-bands of the PPF-DFT filter banks, by either a quarter-band or a sixth-band complex bandshift, and are followed by an eighth-band complex bandshift; and sub-band demultiplexers, coupled to the k sets of sub-band output signals of the k stage sub-band definition network, that demultiplex each of the sub-band output signals to obtain k sets of demultiplexed sub-band channel signals.

In one exemplary embodiment the complex baseband digital signal generator is configured to generate the half-band complex bandshift without the need for multipliers.

In one exemplary embodiment the k stage sub-band definition network is operative to generate the quarter-band complex bandshift with, on average, one-half of the number of multiplications normally needed; or to generate the sixth-band complex bandshift with, on average, one-third of the number of multiplications normally needed.

In one exemplary embodiment, k is a number of stages, of the k stage sub-band definition network, and can be equal to the number of unique nested sets of FDM channels minus one.

In one exemplary embodiment, a section of the each stage of the k stage sub-band definition network includes an upper filter bank and a lower filter bank of the plurality of PPF-DFT filter banks that process an input band signal of the section to produce even sub-band output signals and odd sub-band output signals.

In one exemplary embodiment the complex baseband digital signal generator, sub-band definition network, and the sub-band demultiplexers can be implemented in a complementary metal oxide semiconductor (CMOS) integrated circuit.

In one exemplary embodiment the system can further include a digital logic clock signal that is operative to be disabled in branches of the k stage sub-band definition network or the sub-band demultiplexers, whenever the branches do not include active channels.

In another exemplary embodiment of the present invention, a system for demultiplexing an RF signal including at least two nested sets of frequency division multiplexed (FDM) channels extending over a bandwidth B is disclosed. The system can include baseband converting means for converting the RF signal to a baseband signal where the center frequency of the converted baseband signal is offset from DC by an amount equal to an integer multiple of the channel spacing of a widest of the nested FDM channels; analog to digital converting means for converting the baseband signal to a digital signal at a sampling rate equal to four times the offset; complex baseband digital signal generating means, coupled to the analog to digital converting means, for performing a half-band complex bandshift of the digital signal and for filtering the half-band complex bandshifted signal with a two to one decimating, symmetric, half-band finite impulse response (FIR) filter for generating a complex baseband digital signal; k stage sub-band definition network means, coupled to the complex baseband digital signal generating means, for dividing the complex baseband digital signal into k sets of sub-band output signals by sub-band definition filtering, where each stage of the k stage sub-band definition network means includes a plurality of parallel polyphase-discrete Fourier transform (PPF-DFT) filter bank means for filtering, where the PPF-DFT filter bank means, where appropriate to align sub-band signals with filter pass-bands of the PPF-DFT filter bank means, include quarter-band means for performing a preceding quarter-band complex bandshift, or sixth-band means for performing a preceding sixth-band complex bandshift, and are followed by eighth-band means for performing a eighth-band complex bandshift; and sub-band demultiplexing means, coupled to the k sets of the sub-band output signal means of the k stage sub-band definition network means, for demultiplexing each of the sub-band output signals to obtain k sets of demultiplexed sub-band channel signal means for providing a demultiplexed sub-band channel signal.

In one exemplary embodiment the complex baseband digital signal generating means is further configured for generating the half-band complex bandshift without the need for multipliers.

In one exemplary embodiment the k stage sub-band definition network means further includes generating the quarter-band means where the quarter-band means uses, on average, one-half of the multiplications normally needed; or generating the sixth-band means where the sixth-band means uses, on average, one-third of the multiplications normally needed.

In one exemplary embodiment, k is a number of stages, of the k stage sub-band definition network means and is equal to a number of unique nested sets of FDM channels minus one.

In one exemplary embodiment, a section of the each stage of the k stage sub-band definition network means includes an upper filter bank means and a lower filter bank means of the plurality of PPF-DFT filter bank means for processing an input band signal of the section and for producing an even sub-band output signal and an odd sub-band output signal of the sub-band output signals.

In one exemplary embodiment each of the complex baseband digital signal generator means, sub-band definition network means, and sub-band demultiplexing means can be implemented in a complementary metal oxide semiconductor (CMOS) integrated circuit.

In one exemplary embodiment the system can further include a digital logic clock signal disabling means for disabling a clock signal in branches of the k stage sub-band definition network means or the sub-band demultiplexing means, whenever the branches include only inactive channels.

In yet another exemplary embodiment of the present invention, a method for demultiplexing an RF signal including at least two nested sets of frequency division multiplexed (FDM) channels extending over a bandwidth B is disclosed.

In one exemplary embodiment the method can include converting the RF signal to a baseband signal where a center frequency of the baseband signal is offset from DC by an amount equal to an integer multiple of the channel spacing of a widest of the nested sets of FDM channels; converting the baseband signal to a digital signal at a sampling rate equal to four times the offset; performing a half-band complex bandshift of the digital signal, and filtering the half-band complex bandshifted signal with a two to one decimating, symmetric, half-band finite impulse response (FIR) filter, obtaining a complex baseband digital signal; dividing the complex baseband digital signal into k sets of sub-band output signals, outputting sub-band output signals by sub-band definition filtering, including filtering using a plurality of parallel polyphase-discrete Fourier transform (PPF-DFT) filter banks, and aligning, where appropriate sub-band is signals with filter pass-bands of the PPF-DFT filter bank means comprising performing a preceding quarter-band complex bandshift, or performing a preceding sixth-band complex bandshift, and performing a following eighth-band complex bandshift; and demultiplexing each of the sub-band output signal means to obtain k sets of demultiplexed sub-band channel signals.

To address applications where a large number of channels need to be multiplexed, a novel architecture has been developed that exploits the efficiency of the PPF-DFT filter bank to divide the spectrum of the signal to be demultiplexed into sub-bands. The number of sub-bands is chosen such that each contains a sufficiently small number of channels to allow the sub-band to be demultiplexed with a low order PPF-DFT filter bank. This filter bank can be implemented with smaller coefficient and arithmetic bit widths thus saving power and mass over the direct approach.

The PPF-DFT sub-band definition filtering architecture can use two identical PPF M-DFT N filter banks, with a $\pi/N$ complex bandshift to divide the input signal spectrum into an integer P even and P odd sub-bands, each with a factor of 2P less bandwidth and channels to be demultiplexed. The sub-bands are demultiplexed with identical PPF-DFT filter banks, the order of which is a factor of 2P less than the order of the conventional single stage PPF-DFT filter bank demultiplexer. Moreover, the sub-band definition filtering architecture results in a tree-like structure which can be "pruned," e.g., CMOS ASIC clock disabled, to eliminate branches containing no active channels to save power.

Advantageously, a feature of the invention can minimize power consumption in applications exhibiting active channel sparsity and critically limited power consumption constraints. As a consequence, the transition bands of the PPF-DFT filter banks can be allowed bandwidths equal to one-half of the filter banks' output sampling rate, thereby admitting very low order, hence computationally efficient, polyphase filters in the sub-band definition network implementation of the present invention.

Further features and advantages of the invention, as well as the structure and operation of various exemplary embodiments of the invention, are described in detail below with reference to the accompanying drawings.

BRIEF DESCRIPTION OF THE DRAWINGS

The foregoing and other features and advantages of the invention will be apparent from the following, more particular description of a preferred embodiment of the invention, as illustrated in the accompanying drawings. In the drawings, like reference numbers generally indicate identical, functionally similar, and/or structurally similar elements. The left most digits in the corresponding reference number indicate the drawing in which an element appears first.

FIG. 2A depicts the base band analog signal spectrum for the exemplary FDM signal band from FIG. 1, centered on the IF of 31.25 MHz, which is one fourth of the input sample FIG. 2B depicts the exemplary FDM signal band after conversion from an analog to a digital signal;

FIG. 7A depicts a block diagram of an exemplary embodiment of an A sub-band demultiplexer and an exemplary embodiment of a B,C and D sub-band demultiplexer according to the present invention;

DETAILED DESCRIPTION OF AN EXEMPLARY EMBODIMENT OF THE PRESENT INVENTION

A preferred embodiment of the invention is discussed in detail below. While specific exemplary implementation embodiments are discussed, it should be understood that this is done for illustration purposes only. A person skilled in the relevant art will recognize that other components and configurations may be used without parting from the spirit and scope of the invention.

Figure 1A:
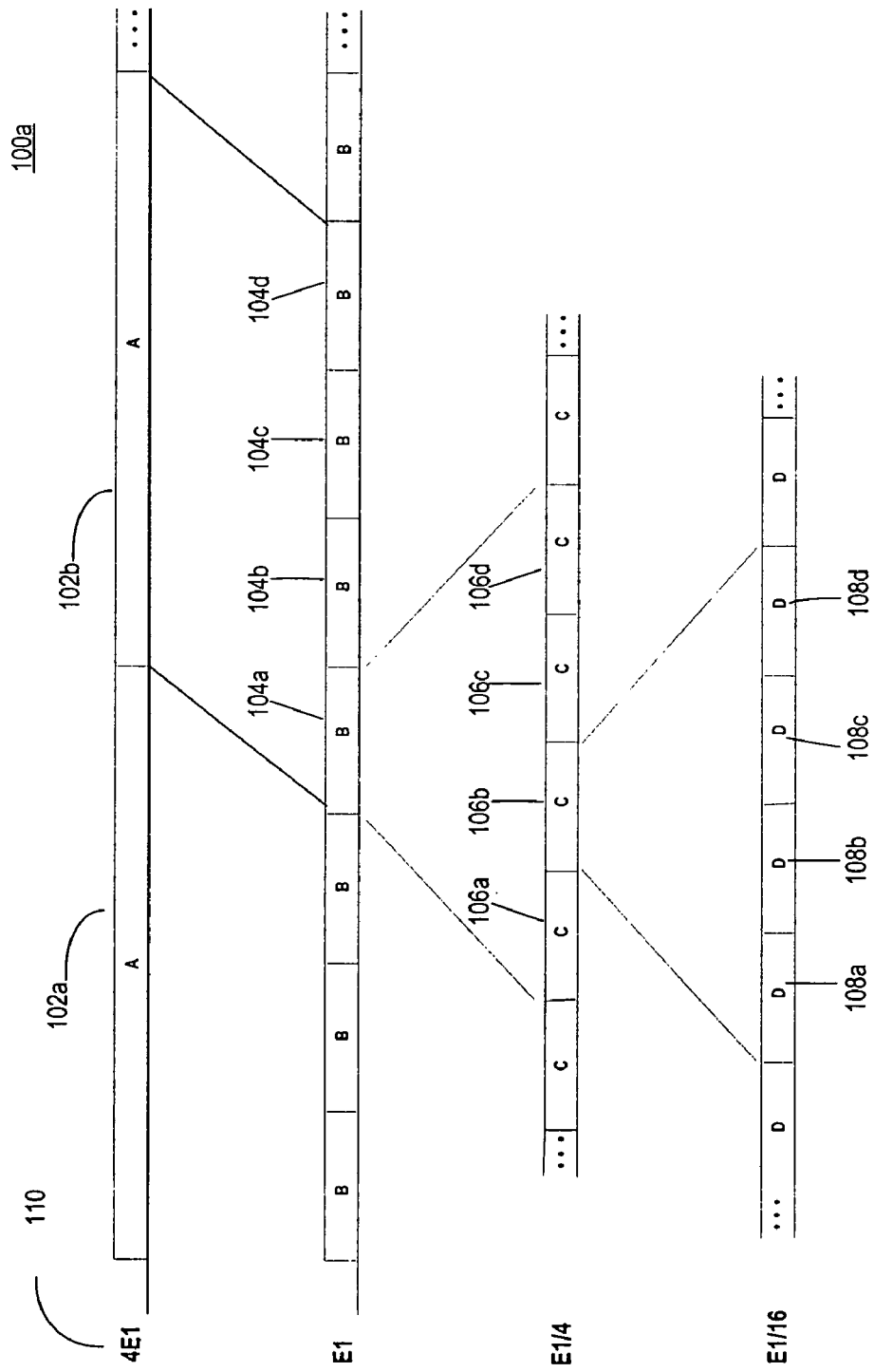
FIG. 1A depicts an exemplary FDM signal band and nested sub-band structure according to the present invention.

FIG. 1A depicts an exemplary embodiment of an FDM signal band 100a and exemplary nested sub-bands 102, 104, 106 and 108 according to the present invention. The A sub-bands 102a, 102b, 102c and 102d (collectively 102) can contain the widest channel with the highest power and highest rate of transmission. Each A-sub band 102a,b,c and d can contain, in an exemplary embodiment, up to four B sub-bands 104a–d. Each B sub-band 104a–d can contain up to 4 C sub-bands 106a–d. Each C sub-band 106a–d can contain up to 4 D sub-bands 108a–d. Note that if an A sub-band channel 102 is operative, none of the sub-band channels B, C and D within the A sub-band can be operative. Similarly, if a B sub-band channel 104 is operative, none of the C and D sub-band channels within the B sub-band can be operative. Also note that while this exemplary embodiment shows 4 levels of sub-band nesting, any integer number of levels is possible.

In an exemplary embodiment, each A sub-band channel 102 can be equivalent to a 4E1 European telecommunications channel as shown in exemplary bandwidths 110. Alternatively, each A sub-band 102 can contain up to four E1 channels, or any other exemplary combination of E1, E1/4, and E1/16 signalling channels. It will be apparent to those skilled in the art that alternative sub-band channel bandwidths, such as, e.g., a T1 telecommunications channel, can be used according to the present invention.

Figure 1B:
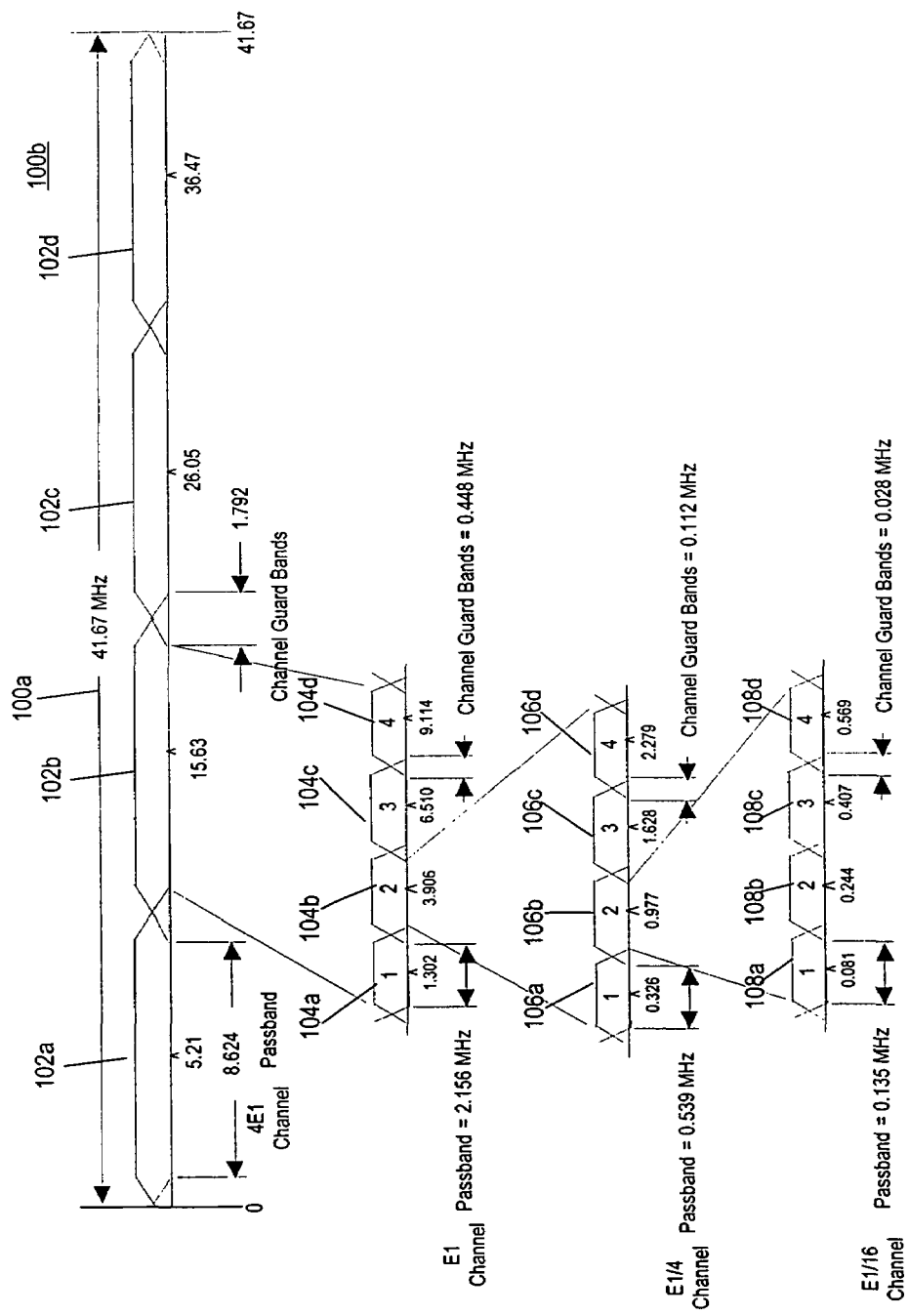
FIG. 1B depicts a specific exemplary embodiment of nested sets of FDM channels according to the present invention.

FIG. 1B depicts nested FDM channels within an exemplary implementation embodiment of a channel 100b where an exemplary input signal 100a to be demultiplexed has a bandwidth of 41.67 MHz. The exemplary input signal 100a can contain up to four A sub-bands 102a–d, where each A sub-band can contain, in the exemplary embodiment, a 4E1 FDM channel. In an exemplary implementation embodiment, the A sub-bands 102a–d can have a 4E1 channel passband of 8.624 MHz and a channel guard band of 1.792 MHz. In an exemplary implementation embodiment, A sub-band 102b can contain up to four B sub-bands 104a–d.

In an exemplary implementation embodiment, said B sub-bands 104a–d can have a E1 FDM channel passband of 2.156 MHz and a channel guard band of 0.448 MHz. In an exemplary implementation embodiment, B sub-band 104b can contain up to four C sub-bands 106a–d. In an exemplary implementation embodiment, said C sub-bands 106a–d can have an E1/4 FDM channel passband of 0.539 MHz and a channel guard band of 0.112 MHz. In an exemplary implementation embodiment, C sub-band 106b can contain up to four D sub-bands 108a–d. In an exemplary implementation embodiment, said D sub-bands 108a–d can have an E1/16 FDM channel passband of 0.135 MHz and a channel guard band of 0.028 MHz.

FIG. 2A depicts the real analog signal spectrum for the exemplary FDM signal band 100a. The real analog signal spectrum is symmetric about the origin in the frequency domain. The real analog signal spectrum can be centered on a frequency equal to one-fourth of a sampling rate of the input signal. The sampling rate of the input signal $f_s$ can be set to $$f_s = (2^p) \times (3^q) \times (\text{bandwidth of the largest band});$$

where q can be an integer greater than or equal to 0, or equal to zero if possible, or otherwise minimized, and p can be minimized such that $$(2^{p-1}) \times (3^q) \times (\text{bandwidth of the largest band}) > \text{bandwidth of the input signal to be demultiplexed}$$

Using the values from the exemplary implementation embodiment of FIG. 1A, $f_s = (2^2) \times (3^1) \times (10.42 \text{ MHz}) \approx 125$ MHz. Exponents p=2 and q=1 were chosen in the exemplary embodiment to correspond to the exemplary implementation depicted in FIG. 1B, below, where $$(2^1) \times (3^1) \times (10.42 \text{ MHz}) > 41.67 \text{ MHz, while}$$

$$(2^1) \times (3^0) \times (10.42 \text{ MHz}) < 41.67 \text{ MHz}$$

FIG. 2B depicts an exemplary embodiment of an FDM signal band 100a after conversion from an analog to a digital signal. The positive portion of the exemplary FDM signal band 100a is centered at one-fourth the input sampling rate frequency. The four A sub-bands 102a–d that can be contained within FDM signal band 100a are also shown.

Figure 3:
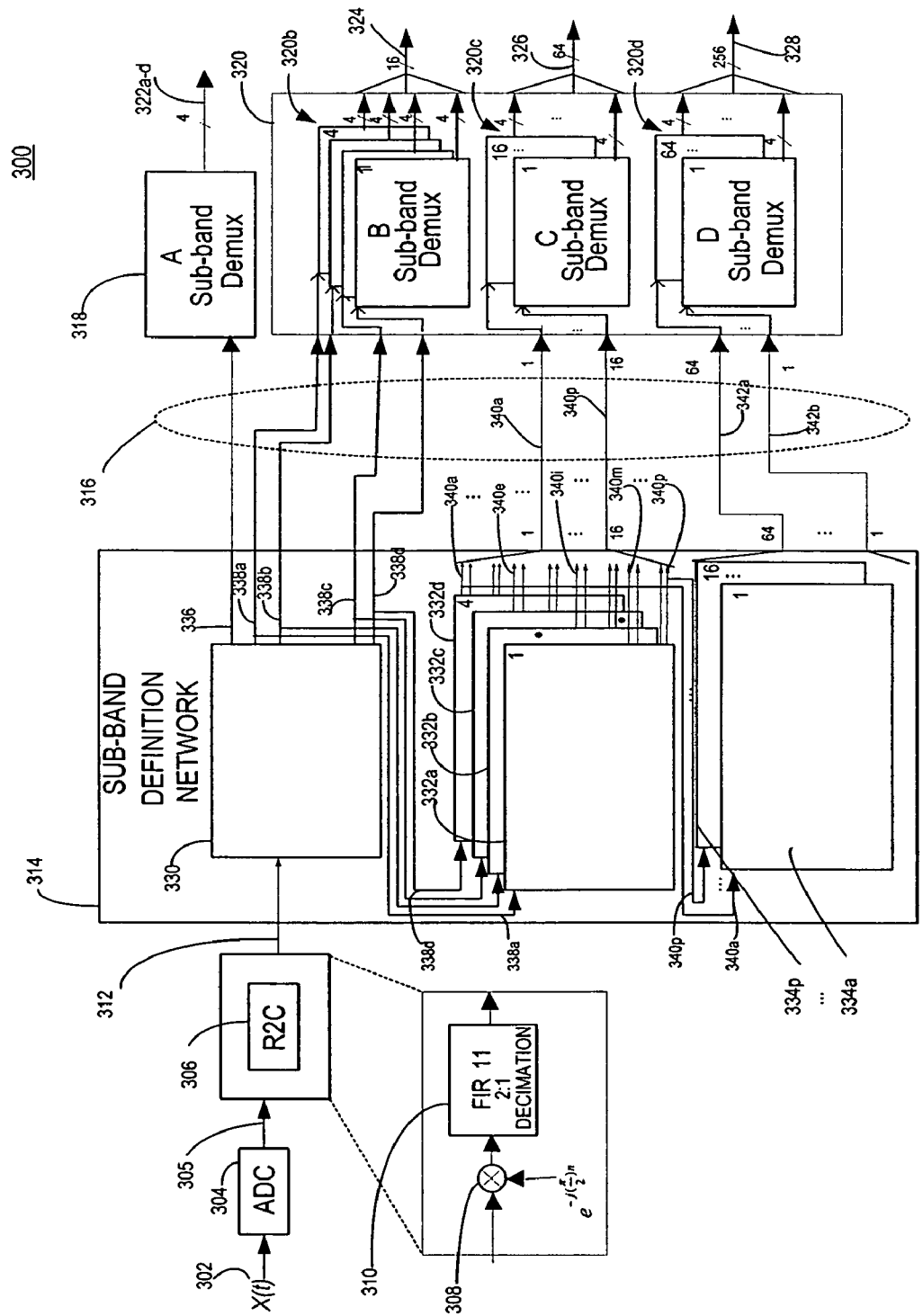
FIG. 3 depicts a block diagram of the components and data flow that include an exemplary embodiment of the present invention.

FIG. 3 is a block diagram 300 depicting the components and data flow that comprise an exemplary embodiment of the present invention. A FDM signal 302 is input to an analog to digital converter (ADC) 304. The output signal 305 from the ADC is input to a real-to-complex (R2C) converter 306. The R2C converter 306 can include (as shown) a half-band complex bandshift 308 and a low order symmetric, half-band 2:1 decimating finite impulse response (FIR) filter 310. The half-band complex bandshift 308 is accomplished by multiplying the digital input signal by $e^{-j(\pi/2)n}$. In an exemplary implementation embodiment, said half-band complex bandshift can be accomplished without multiplication operations, thereby saving power.

The output 312 from R2C 306 can then be input to a k stage sub-band definition network 314. The outputs from the k stage sub-band definition network 314, collectively called 316 can be input to a plurality of low-order demultiplexers 320 that can be identical or a low-order A sub-band demultiplexer 318 as shown in an exemplary embodiment. The outputs 322, 324, 326 and 328 of the low-order demultiplexers 318 and 320 are the individual demultiplexed nested FDM channels.

Sub-band definition network 314 can include PPF-DFT filter banks 330, 332 and 334. When at least one of the A sub-band channels 102 is operative, the output 336 from PPF-DFT filter bank 330 can be input to low-order A sub-band demultiplexer 318. In an exemplary embodiment, the outputs 332a–d of low-order A sub-band demultiplexer 318 can be the up to four A sub-band FDM channels that can be contained in the input signal 302. Note that if any of the A sub-band channel outputs 332a–d are used, then none of the up to four B sub-band channels, the up to sixteen C sub-band channels or the up to sixty-four D sub-band channels that could have been nested in the operative A sub-band FDM channel can be used. In an exemplary implementation embodiment, the components of the sub-band definition filtering architecture that could have been used to demultiplex the nested B, C, and D channels can have their clock disabled, thereby preserving power.

When at least one of the A channels 102 is not operative, one or more of the outputs 338a–d from PPF-DFT filter bank 330 can be input to B sub-band demultiplexer (320b) in the plurality of low-order demultiplexers 320. The outputs 324 of the B sub-band demultiplexer 320b can include up to sixteen B channels 104 from up to four A channels 102.

Alternately, when at least one of the B channels 104 is not operative, one or more of the outputs 338a–d from PPF-DFT filter bank 330 can be input to a second stage PPF-DFT filter bank 332 of sub-band definition network 314. In an exemplary embodiment, the second stage PPF-DFT filter bank 332 of sub-band definition network 314 can include parallel PPF-DFT filter banks 332a–d.

In an exemplary embodiment, when at least one of the B channels 104 is not operative, one or more of the outputs 340a–p from PPF-DFT filter banks 332a–d can be input to a C sub-band demultiplexer 320c of the plurality of low-order demultiplexers 320. The low-order demultiplexers 320 can be identical. The outputs 326 of the C sub-band demultiplexer 320c can include up to sixty-four C channels 106, from up to four A channels 102, and up to sixteen B channels 104.

In an exemplary embodiment, when at least one of the B channels 104 and at least one of the C channels 106 are not operative, one or more of the outputs 340a–p from parallel PPF-DFT filter banks 332a–d can be input to a third-stage PPF-DFT filter bank 334 of sub-band definition 15 network 314, including parallel PPF-DFT filter banks 334a–p.

In an exemplary embodiment, when at least one of the A channels 102 and at least one of the B channels 104 and at least one of the C channels 106 are not operative, one or more of the sixty-four outputs 342a, b collectively named 342 from parallel PPF-DFT filter banks 334a–p can be input to a D sub-band demultiplexer 320d in the plurality of low-order demultiplexers 320. The low-order demultiplexers 320 can be identical. The outputs 328 of the D sub-band demultiplexer can include up to two hundred fifty six D channels 108 from up to four A channels 102, up to sixteen B channels and up to 64 C channels 106.

Figure 4:
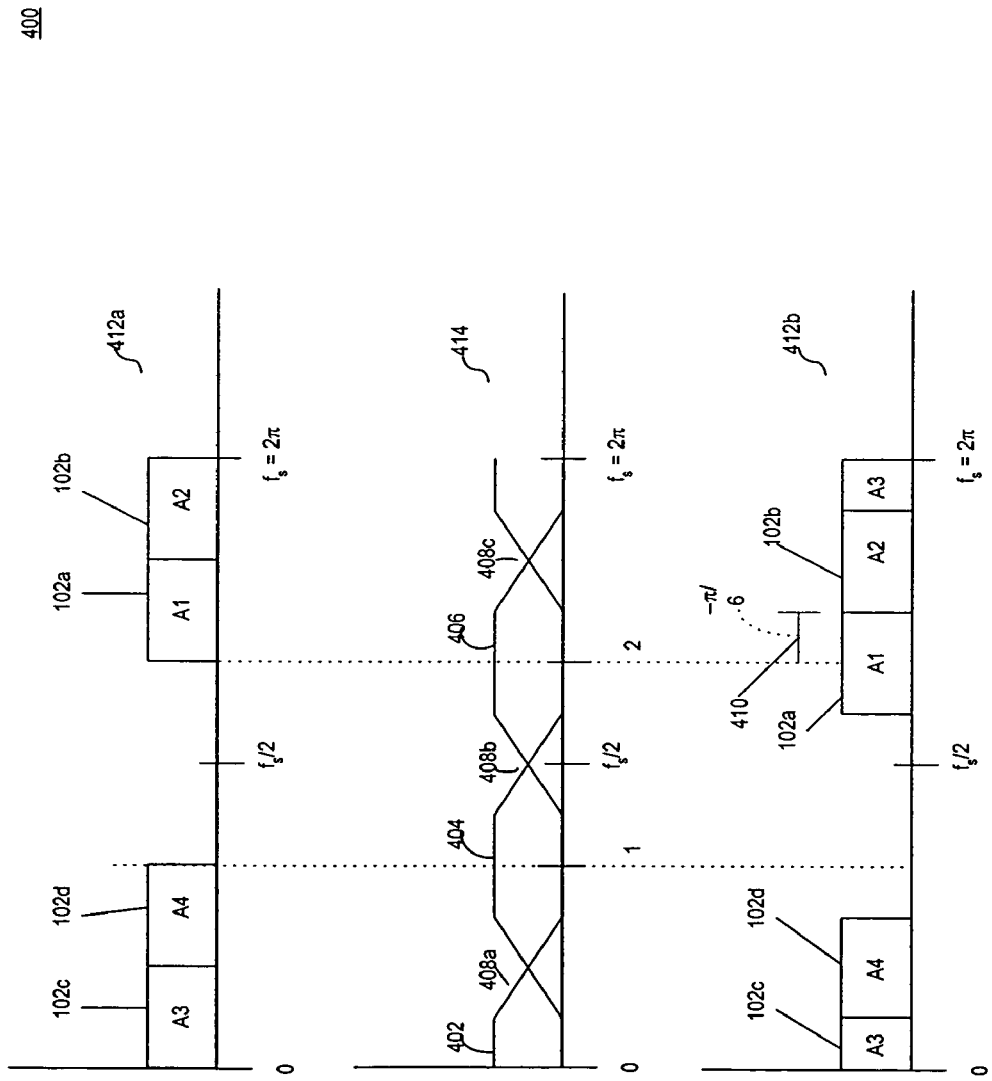
FIG. 4 depicts the effect of a real to complex conversion of an exemplary digital signal, the passbands of the first stage of the sub-band definition network, and the effects of a bandshift on the exemplary digital signal.

FIG. 4 depicts an exemplary embodiment of various graphs 412a, 412b and 414 of signals illustrating effects 400 of a real to complex (R2C) conversion followed by a sixth-band complex bandshift on an exemplary digital signal.

Specifically, graph 412a depicts an exemplary embodiment of a signal 312 resulting from passing an exemplary real digital signal output signal 305, as shown in FIG. 2B, from ADC 304 through a R2C 306 from FIG. 3.

Graph 412a includes four A bands 102a–d of signal 312. Graph 414 depicts an exemplary embodiment of filter passbands 402, 404 and 406 contained in the first PPF-DFT filter bank 330 of sub-band definition network 314. A signal aligned with the filtering passbands 402, 404, 406 will not be attenuated.

Graph 414 includes transition bands 408a, 408b and 408c between the filter passbands 402, 404, 406. A signal aligned with the transition band areas 408a–c can not be preserved. The reader should note that the centers of the complex sub-bands 102a–d in graph 412a are not aligned with the passbands 402–406 in graph 414, as indicated by the dashed lines. In order to align the complex sub-bands 102a–d with the passbands 402–406, an exemplary embodiment of the present invention can perform a positive and a negative sixth-band bandshift 502b, 502a. A sixth-band bandshift 502b can be accomplished by multiplying the signal by $e^{j(\pi/6)n}$.

Graph 412b depicts an exemplary embodiment of a graph of a signal 336 produced by a $_{-\pi}/6$ bandshift described further below with reference to FIG. 5, resulting from a negative sixth-band bandshift on R2C 306 output 312. In an exemplary embodiment, sub-band A1 102a can align with passband 2 406 and sub-band A3 102c can align with passband 0 402. In this instance, passband 1 404 is not used, and power can be conserved by avoiding calculations associated with passband 1 404. Sub-bands A2 102b and A4 102d align with transition bands 408a,c and are not recovered. In order to align sub-bands A2 102b and A4 102d, a positive sixth-band bandshift can be performed on R2C 306 output 312 shown in graph 412a, to align the complex sub-bands 102b, 102d with passbands 402, 404.

Figure 5:
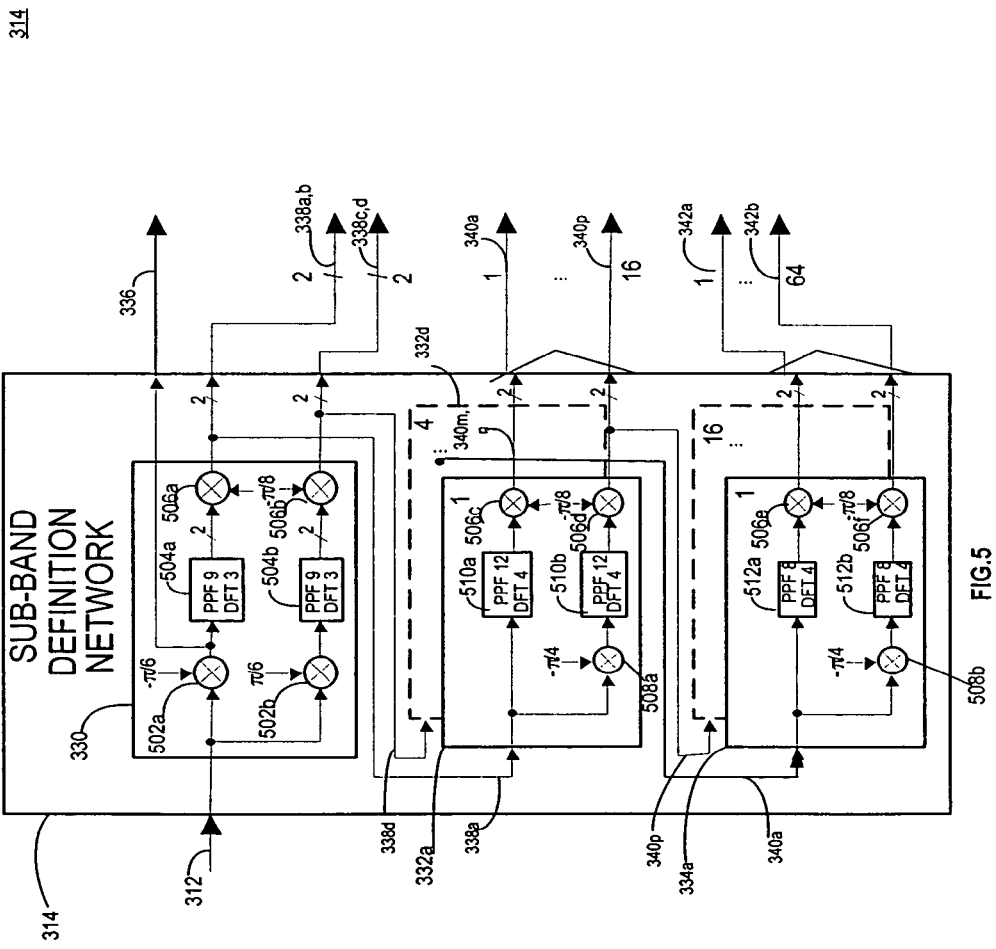
FIG. 5 depicts an exemplary embodiment of the sub-band definition network according to the present invention.

FIG. 5 depicts an exemplary embodiment of the sub-band definition network 314 according to the present invention. In an exemplary embodiment, the sub-band definition network 314 can include, e.g., a number of k=3 stages of PPF-DFT filter banks 330, 332, 334. Sub-band definition network 314 can include the first PPF-DFT filter bank 330. The number of stages k, in the exemplary embodiment, set equal to three (3), can arise from the use of four (4) unique sets of nested channels, less one (1).

First PPF-DFT filter bank 330, in an exemplary embodiment, can include of an input 312, and an upper and a lower path (not labeled but shown in FIG. 5).

The upper path can include a negative sixth-band bandshift 502a. The results of the sixth-band bandshift 502a are as depicted in FIG. 4, graph 412b. The notation of $\pm_\pi/m$ at bandshifts 502a and 502b will hereafter be used to denote a positive, and negative mth-band bandshifts caused by multiplying a complex signal by $e^{\pm j(\pi/m)n}$. The shifted output of the negative sixth-band bandshift 502a can become output 336. Output 336 can be further demultiplexed by A sub-band demultiplexer 318 to generate outputs 322a–d, depicted in FIG. 3, corresponding to the four A bands 102a–d of FIG. 1A. The upper path can further include a PPF 9-DFT 3 filter bank 504a and a negative eighth-band bandshift 506a. The two outputs from the PPF 9-DFT 3 filter bank 504a become outputs 338a,b after the negative eighth-band bandshift 506a.

The lower path of first PPF-DFT filter bank 330 can include a sixth-band bandshift 502b. The lower path can further include a PPF 9-DFT 3 filter bank 504b and a negative eighth-band bandshift 506b. The two outputs from the PPF 9-DFT 3 filter bank 504b can become outputs 338c,d after the negative eighth-band bandshift 506b. Outputs 338a–d can be demultiplexed by B sub-band demultiplexer 320b to generate outputs 324 that can correspond, in an exemplary embodiment, to the sixteen B subband channels 104a–d from FIG. 1A corresponding to, e.g., 16 E1 channels from FIG. 1B.

Sub-band definition network 314 can further include, in an exemplary embodiment, a second stage PPF-DFT filter bank 332. The second stage PPF-DFT filter bank 332 can include four parallel PPF-DFT filter banks 332a–d. All parallel PPF-DFT filter banks 332a–d can be identical. Parallel PPF-DFT filter banks 332a–d can receive outputs 338a–d, respectively.

First second stage parallel PPF-DFT filter bank 332a can include an input 338a, and an upper and a lower path (not labeled but shown in FIG. 5).

The upper path can include a PPF 12-DFT 4 filter bank 510a and a negative eighth-band bandshift 506c. The two outputs from the PPF 12-DFT 4 filter bank 510a can become outputs 340m,n after the negative eighth-band bandshift 506c.

The lower path of first parallel PPF-DFT filter bank 332a can include a negative quarter-band bandshift 508a. The lower path can further include a PPF 12-DFT 4 filter bank 510b and a negative eighth-band bandshift 506d. The two outputs from the PPF 12-DFT 4 filter bank 510b can become outputs 340o,p after the negative eighth-band bandshift 506d. Outputs 340a–p can then be demultiplexed by C sub-band demultiplexer 320c to generate outputs 326 that can correspond, in an exemplary embodiment, to the sixty-four C sub-band channels 106 from FIG. 1A, corresponding to, e.g., 64 E1/4 channels from FIG. 1B.

Sub-band definition network 314 can further include, in an exemplary embodiment, a third stage PPF-DFT filter bank 334. The third stage PPF-DFT filter bank 334 can include sixteen parallel PPF-DFT filter banks 334a–p. Parallel PPF-DFT filter banks 334a–p can receive outputs 340a–p. All parallel PPF-DFT filter banks 334a–p can be identical.

First third stage parallel PPF-DFT filter bank 334a can include an input 340a, and an upper and a lower path (not labeled but shown in FIG. 5).

The upper path can include a PPF 8-DFT 4 filter bank 512a and a negative eighth-band bandshift 506e. The two outputs from the PPF 8-DFT 4 filter bank 512a can become two of the sixty-four outputs 342a, 342b after the negative eighth-band bandshift 506e.

The lower path of first third stage PPF-DFT filter bank 334a can include a negative quarter-band bandshift 508b. The lower path can further include a PPF 8-DFT 4 filter bank 512b and a negative eighth-band bandshift 506f. The two outputs from the PPF 8-DFT 4 filter bank 512b can become two of the sixty-four outputs 342a, 342b after the negative eighth-band bandshift 506f. Outputs 342a,b can be demultiplexed by D sub-band demultiplexer 320d to generate outputs 328 that can correspond, in an exemplary embodiment, to the two hundred fifty-six D sub-band channels possible from FIG. 1A, corresponding to, e.g., 256 E1/16 channels from FIG. 1B.

As will be apparent to those skilled in the art, additional stages of PPF-DFT filter banks 330, 332, 334, although not shown, can be used within the scope of the present invention.

Figure 6A:
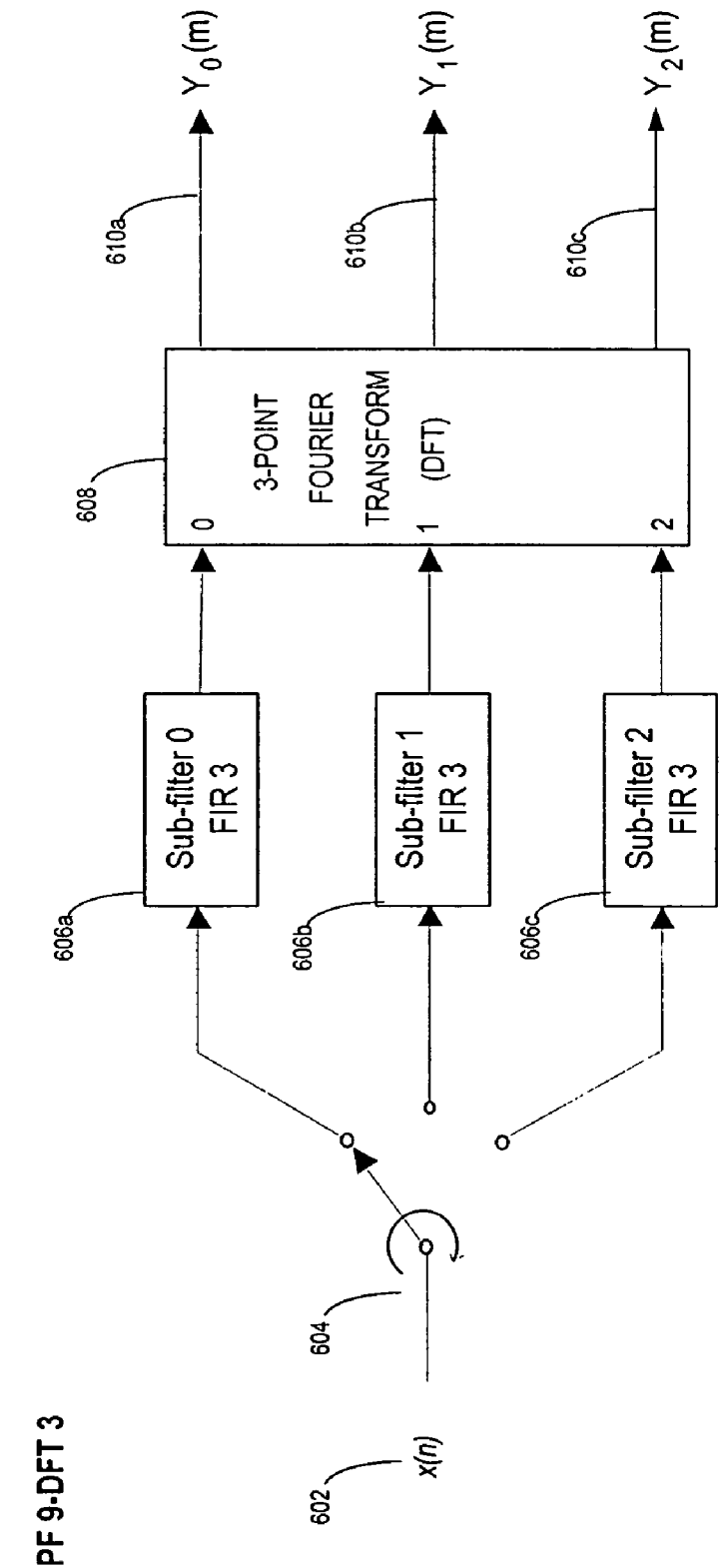
FIG. 6A depicts a block diagram of the components of a PPF 9-DFT 3 filter bank.

FIG. 6A depicts an exemplary embodiment of a block diagram of the components of a nine tap PPF 9-DFT 3 filter bank 504. In an exemplary implementation, PPF 9-DFT3 filter bank 504 can include an input signal 602. The sub-bands of input signal 602 can be aligned to the passbands of the PPF9-DFT3 filter bank 504 as described in the discussion of FIG. 4. Input signal 602 can be input to commutator 604, and a prototype filter's coefficients can be distributed to three FIR-3 sub-filters 606a–c. The outputs of the FIR-3 sub-filters 606a–c can be input to the DFT-3 608. The reader may recall that the calculation for a DFT is given as $$Y_k(m) = \sum_{n=0}^{N-1} x_{n_m} e^{-j2\frac{\pi}{N}nk}$$

where N is the number of bins, k is the bin number and x is a complex number. The PPF9-DFT3 504 filters the signal as described in the discussion of FIG. 4. Passbands 0, 1 and 2 as described in FIG. 4 correspond to the three outputs 610a, b and c of DFT-3 608. In an exemplary embodiment, the user can configure the PPF-DFT filtering architecture such that passband 0 is used in all paths of a PPF-DFT filter bank, while passbands 1 and 2 can be used on fewer of the paths in the PPF-DFT filter bank. The passband 0 calculation is the most efficient because it does not require any multiplications, thus conserving power. The user can further improve efficiency by using the minimum order and number of FIR filters possible for a particular embodiment. In an exemplary embodiment, one of the three DFT-3 outputs 610a–c will not be used. The remaining two outputs can be input to the negative eighth-band complex bandshift 506a,b.

Figure 6B:
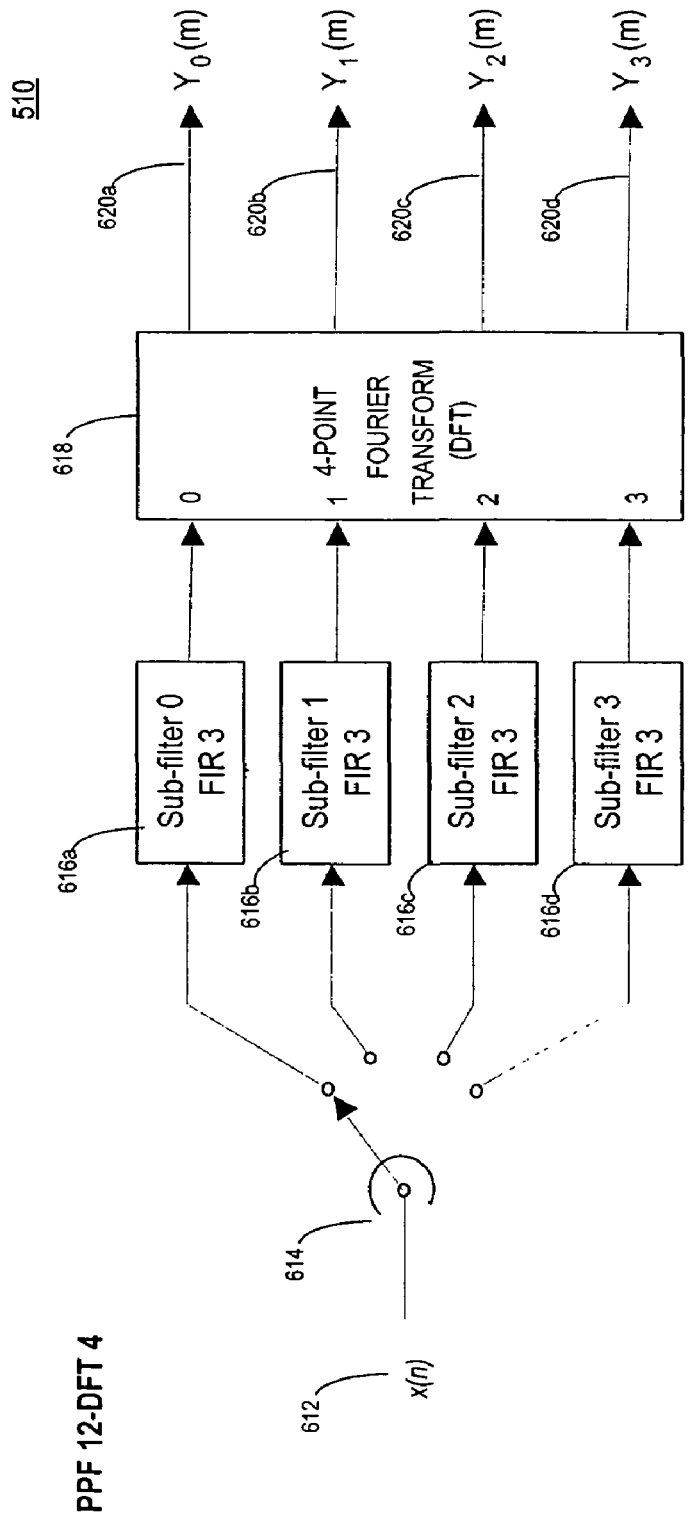
FIG. 6B depicts a block diagram of the components of a PPF 12-DFT 4 filter bank.

FIG. 6B depicts an exemplary embodiment of a block diagram 510 of the components of a twelve tap PPF 12-DFT 4 filter bank 510a, 510b (collectively 510). In an exemplary implementation, PPF12-DFT4 filter bank 510 can include an input signal 612. The sub-bands of the input signal 612 can be aligned to the passbands of the PPF12-DFT4 filter bank 510 in a manner similar to that described in the discussion of FIG. 4. Input signal 612 can be input to commutator 614, and a prototype filter's coefficients can be distributed to four FIR-3 sub-filters 616a–d. The outputs of the FIR-3 sub-filters 606a–d can be input to the DFT-4 618. The PPF12-DFT4 510 can filter the signal in a manner analogous to that described in the discussion of FIG. 4. In an exemplary embodiment, two of the four DFT-4 outputs 620a–d can be unused. The remaining two outputs can be input to the negative eighth-band complex bandshift 506c,d.

Figure 6C:
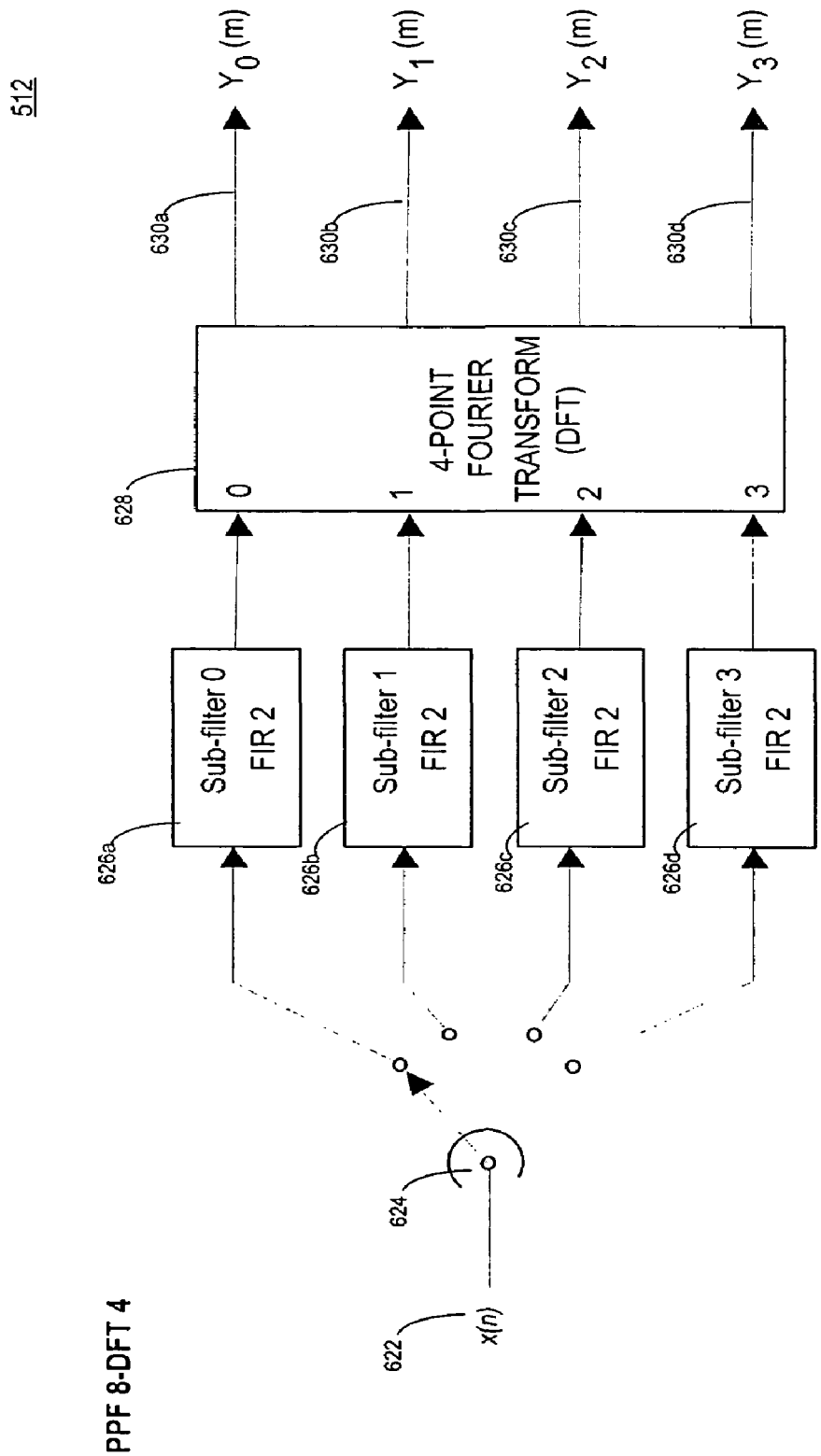
FIG. 6C depicts a block diagram of the components of a PPF 8-DFT 4 filter bank.

FIG. 6C depicts an exemplary embodiment of a block diagram of the components of an eight tap PPF 8-DFT 4 filter bank. In an exemplary implementation, PPF8-DFT4 bank 512 includes an input signal 622. The sub-bands of the input signal 622 can be aligned to the passbands of the PPF8-DFT4 filter bank 512in a manner analogous to that described in the discussion of FIG. 4. Input signal 622 can be input to commutator 624, and a prototype filter's coefficients can be distributed to four FIR-2 sub-filters 626a–d. The outputs of the FIR-2 sub-filters 626a–d can be input to the DFT-4 628. The PPF8-DFT4 filter bank 512 can filter the signal in a manner analogous to that described in the discussion of FIG. 4. In an exemplary embodiment, two of the four DFT-4 outputs 630a–d can be unused. The remaining two outputs can be input to the negative eighth-band complex bandshift 506e,f.

FIG. 7A depicts a block diagram 700 of an exemplary embodiment of an A sub-band demultiplexer 318 and an exemplary embodiment of a B, C and D sub-band demultiplexer 320b, c,d according to the present invention.

The A sub-band demultiplexer 318 of FIG. 3 can be implemented with a PPF36-DFT6 filter 318, including a PPF36 706 and a DFT6 708, described further below with reference to FIG. 7B. The B, C, and D sub-band demultiplexers 320b,c,d collectively labeled 320 in FIG. 3 can all be implemented with a plurality of PPF48-DFT8 filter banks 320, each including a PPF48 716 and a DFT8 718, described further below with reference to FIG. 7C.

Figure 7B:
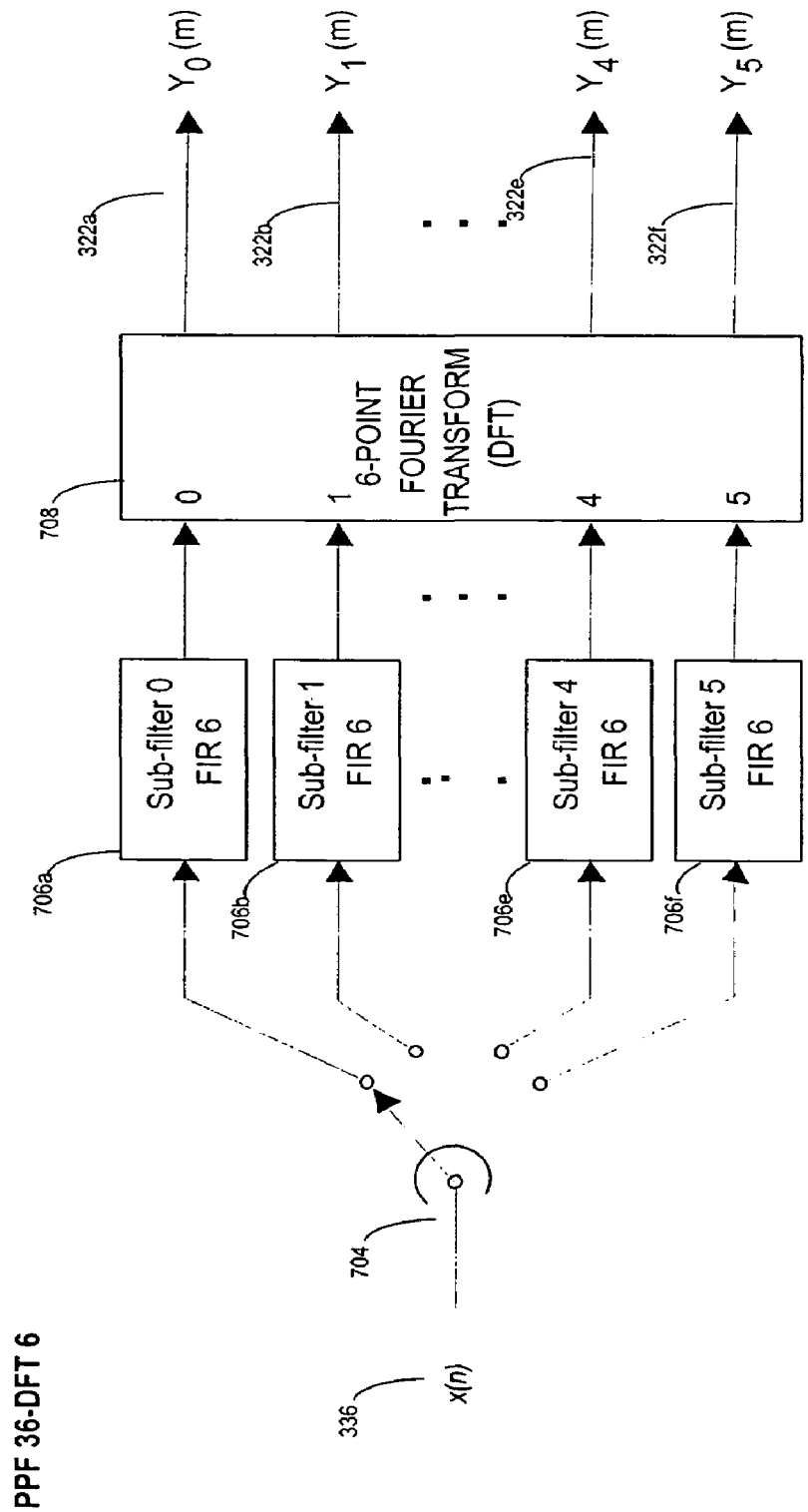
FIG. 7B depicts a block diagram of the components of a PPF 36-DFT 6 filter bank.

FIG. 7B depicts a block diagram of the components of a thirty-six tap PPF 36-DFT 6 filter bank 318. In an exemplary implementation, PPF36-DFT6 bank 318 includes an input signal 336. The A sub-band FDM channels of the input signal 336 can be aligned to the passbands of the PPF36-DFT6 318 in a manner analogous to that described in the discussion of FIG. 4. Input signal 336 can be input to commutator 704, and the prototype filter's coefficients can be distributed to six FIR-6 sub-filters 706a–f. The outputs of the FIR-6 sub-filters 706a–f are input to the DFT6 708. The PPF36-DFT6 318 can filter the signal as described in the discussion of FIG. 4. In an exemplary embodiment, two of the six DFT-6 outputs 322a–f can be unused. In an exemplary embodiment, the remaining four outputs can be the up to four A channels 102.

Figure 7C:
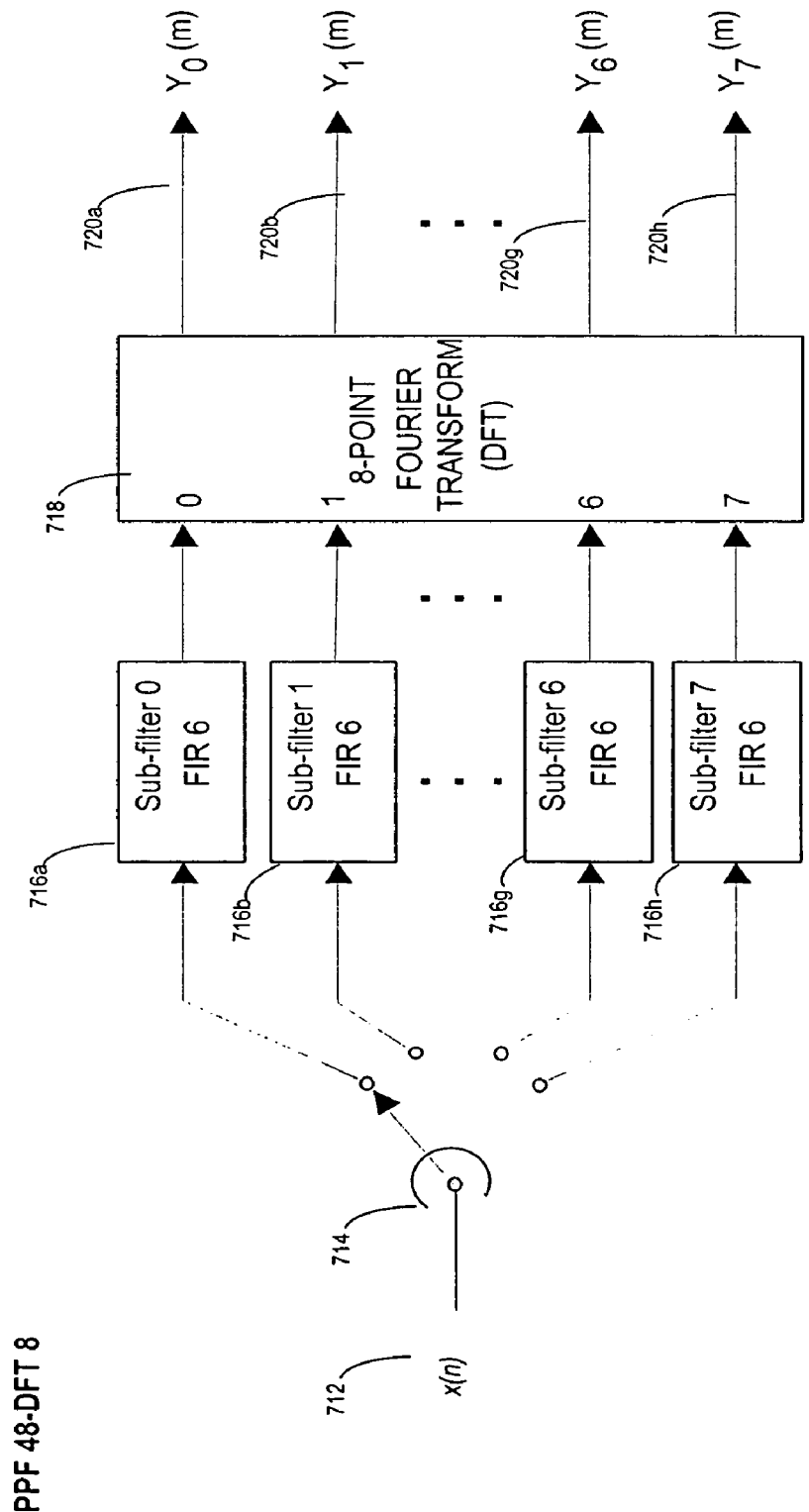
FIG. 7C depicts a block diagram on the components of a PPF 48-DFT 8 filter bank.

FIG. 7C depicts an exemplary embodiment of a block diagram on the components of a forty-eight tap PPF48-DFT8 filter bank 320. In an exemplary implementation, PPF48-DFT8 filter bank 320 can include an input signal 712. The FDM channels of the input signal 712 can be aligned to the passbands of the PPF48-DFT8 320, in a manner analogous to that described in the discussion of FIG. 4. Input signal 712 can be input to commutator 714, and a 48 tap prototype filter's coefficients can be distributed to eight FIR-6 sub-filters 716a–h. The outputs of the FIR-6 sub-filters 716a–h can be input to the DFT-8 718. The PPF48-DFT8 320 can filter the signal in a manner analogous to that described in the discussion of FIG. 4. In an exemplary embodiment, four of the eight DFT-8 outputs 720a–h can be unused. In an exemplary embodiment, the remaining four outputs can constitute up to four of the B channels 104, or up to four of the C channels 106, or up to four of the D channels 108.

What is claimed is:

1. A system that demultiplexes an RF signal including at least two nested sets of frequency division multiplexed (FDM) channels extending over a bandwidth B, the system comprising:
    a baseband converter that converts the RF signal to a baseband signal wherein a center frequency of said baseband signal is offset from DC by an amount equal to an integer multiple of the channel spacing of a widest of the nested FDM channels;
    an analog to digital converter (ADC) that converts said baseband signal to a digital signal at a sampling rate equal to four times said offset;
    a complex baseband digital signal generator, coupled to said analog to digital converter, that performs a half-band complex bandshift of said digital signal and that filters said half-band complex bandshifted signal with a two to one decimating, symmetric, half-band finite impulse response (FIR) filter to generate a complex baseband digital signal;
    a k stage sub-band definition network, coupled to said complex baseband digital signal generator, that divides said complex baseband digital signal into k sets of sub-band output signals by sub-band definition filters, wherein each stage of said k stage sub-band definition network comprises a plurality of parallel polyphase-discrete Fourier transform (PPF-DFT) filter banks, wherein said PPF-DFT filter banks, where appropriate to align sub-band signals with filter pass-bands of said PPF-DFT filter banks, are preceded by at least one of:
        a quarter-band bandshift, and
        a sixth-band complex bandshift, and are followed by an eighth-band complex bandshift; and
    sub-band demultiplexers, coupled to said k sets of sub-band output signals of said k stage sub-band definition network, that demultiplex each of said sub-band output signals to obtain k sets of demultiplexed sub-band channel signals.

2. The system according to claim 1, wherein said complex baseband digital signal generator is configured to generate said half-band complex bandshift without the need for multipliers.

3. The system according to claim 1, wherein said k stage sub-band definition network is operative to at least one of:
    generate said quarter-band conlplex bandshift wherein said quarter-band complex bandshift comprises, on average, one-half of a number of multiplications normally needed; and
    generate said sixth-band complex bandshift wherein said sixth-band complex bandshift comprises, on average, one-third of a number of multiplications normally needed.

4. The system according to claim 1, wherein k is a number of stages, of said k stage sub-band definition network and is equal to a number of unique nested sets of FDM channels minus one.

5. The system according to claim 1, wherein a section of said each stage of said k stage sub-band definition network comprises an upper filter bank and a lower filter bank of said plurality of PPF-DFT filter banks that process an input signal band of said section to produce even and odd subband output signals of said each stage.

6. The system according to claim 1, wherein at least one of said sub-band demultiplexers, said complex baseband digital signal generator, and said sub-band definition network, are implemented in a complementary metal oxide semiconductor (CMOS) integrated circuit (IC).

7. The system according to claim 1, further comprising a digital logic clock signal that is operative to be disabled in branches of at least one of said k stage sub-band definition network and said sub-band demultiplexers, whenever said branches contain only inactive channels.

8. A system for demultiplexing an RF signal including at least two nested sets of frequency division multiplexed (FDM) channels extending over a bandwidth B, the system comprising:
    baseband converting means for converting the RF signal to a baseband signal wherein a center frequency of said baseband signal is offset from DC by an amount equal to an integer multiple of the channel spacing of a widest of the nested FDM channels;
    analog to digital converting means for converting said baseband signal to a digital signal at a sampling rate equal to four times said offset;
    complex baseband digital signal generating means, coupled to said analog to digital converting means, for performing a half-band complex bandshift of said digital signal and for filtering said half-band complex bandshift signal with a two to one decimating, symmetric, half-band finite impulse response (FIR) filter means for generating a complex baseband digital signal;
    k stage sub-band definition network means, coupled to said complex baseband digital signal generating means, for dividing said complex baseband digital signal into k sets of sub-band output signals, and for outputting sub-band output signals by sub-band definition filtering, wherein each stage of said k stage sub-band definition network means comprises a plurality of parallel polyphase-discrete Fourier transform (PPF-DFT) filter bank means for filtering, wherein said PPF-DFT filter bank means, where appropriate to align sub-band signals with filter pass-bands of said PPF-DFT filter bank means comprise at least one of quarter-band means for performing a preceding quarter-band complex bandshift, and sixth-band means for performing a preceding sixth-band complex bandshift, and are followed by eighth-band means for performing a following eighth-band complex bandshift; and sub-band demultiplexing means, coupled to said k sets of said sub-band channel output signal means of said k stage sub-band definition network means, for demultiplexing each of said sub-band output signal means to obtain k sets of demultiplexed sub-band channel signals.

9. The system according to claim 8, wherein said complex baseband digital signal generating means is further configured for generating said half-band complex bandshift without the need for multipliers.

10. The system according to claim 8, wherein said k stage sub-band definition network means further comprises at least one of:

generating said quarter-band means wherein said quarter-band means uses, on average, one-half of the multiplications normally needed; and generating said sixth-band means wherein said sixth-band means uses, on average, one third of the multiplications normally needed.

11. The system according to claim 8, wherein k is a number of stages, of said k stage sub-band definition network means and is equal to a number of unique nested sets of FDM channels minus one.

12. The system according to claim 8, wherein a section of said each stage of said k stage subband definition network means comprises an upper filter bank means and a lower filter bank means of said plurality of PPF-DFT filter bank means for processing an input signal band of said section and for producing an even sub-band output signal and an odd sub-band output signal of said each stage.

13. The system according to claim 8, wherein at least one of said complex baseband digital signal generating means, said sub-band definition network means, and said sub-band demultiplexing means are implemented in a complementary metal oxide semiconductor (CMOS) integrated circuit.

14. The system according to claim 8, further comprising digital logic clock signal disabling means for disabling a clock signal in branches of at least one of said k stage sub-band definition network means and said sub-band demultiplexing means, whenever said branches comprise only inactive channels.

15. A method for demultiplexing an RF signal including at least two nested sets of frequency division multiplexed (FDM) channels extending over a bandwidth B, the method comprising:

converting the RF signal to a baseband signal wherein a center frequency of said baseband signal is offset from DC by an amount equal to an integer multiple of the channel spacing of a widest of the nested FDM channels;

converting said baseband signal to a digital signal at a sampling rate equal to four times said offset;

performing a half-band complex bandshift of said digital signal, and filtering said halfband complex bandshifted signal with a two to one decimating, symmetric, half-band finite impulse response (FIR) filter, thereby obtaining a complex baseband digital signal;

dividing said complex baseband digital signal into k sets of sub-band output signals, outputting sub-band output signals by sub-band definition filtering, including filtering using a plurality of parallel polyphase-discrete Fourier transform (PPF-DFT) filter banks, and aligning, where appropriate sub-band signals with filter pass-bands of said PPF-DFT filter bank comprising at least one of:

performing a preceding quarter-band complex bandshift, and performing a preceding sixth-band complex bandshift, and performing a following eighth-band complex bandshift; and demultiplexing each of said sub-band output signal to obtain k sets of demultiplexed sub-band channel signals.

* * * * *